(12) United States Patent
Wu et al.

(10) Patent No.: US 8,749,982 B2
(45) Date of Patent: Jun. 10, 2014

(54) SERVER BACKPLATE AND SERVER HAVING SAME

(75) Inventors: Hung-Yi Wu, New Taipei (TW); Lei Liu, Guangdong (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 258 days.

(21) Appl. No.: 13/161,504

(22) Filed: Jun. 16, 2011

(65) Prior Publication Data

US 2012/0268884 A1 Oct. 25, 2012

(30) Foreign Application Priority Data

Apr. 25, 2011 (CN) .......................... 2011 1 0103359

(51) Int. Cl.
| | |
|---|---|
| H05K 5/00 | (2006.01) |
| H05K 7/00 | (2006.01) |
| G06F 1/16 | (2006.01) |
| A47B 97/00 | (2006.01) |
| A47B 81/00 | (2006.01) |

(52) U.S. Cl.
USPC ........... 361/724; 361/725; 361/726; 361/727; 312/223.2

(58) Field of Classification Search
USPC ............... 361/724, 725, 726, 727; 312/223.1, 312/223.2, 223.3
See application file for complete search history.

(56) References Cited

U.S. PATENT DOCUMENTS

| | | | |
|---|---|---|---|
| 2003/0048615 A1* | 3/2003 | King et al. ..................... | 361/724 |
| 2008/0298014 A1* | 12/2008 | Franco .......................... | 361/688 |
| 2009/0037625 A1* | 2/2009 | Li .................................. | 710/74 |

FOREIGN PATENT DOCUMENTS

| | | |
|---|---|---|
| CN | 201203822 Y | 3/2009 |
| CN | 201527602 U | 7/2010 |
| CN | 201562195 U | 8/2010 |

* cited by examiner

Primary Examiner — Anthony Haughton
(74) Attorney, Agent, or Firm — Novak Druce Connolly Bove + Quigg LLP

(57) ABSTRACT

A server backplate includes a plate, a power connector, a first connector and a second connector. The plate includes a top surface, a first surface, and a second surface opposing the first surface. The top surface connects the first surface and the second surface. The power connector is arranged on the first surface and configured to couple to a power supply unit. The first connector is arranged on the first surface and configured to couple to a first storage device. The second connector is arranged on the second surface and configured to couple to a second storage device. The power connector is electrically connected to the first connector and the second connector, and the first connector is closer to the top surface than the second connector.

11 Claims, 4 Drawing Sheets

SERVER BACKPLATE AND SERVER HAVING SAME

BACKGROUND

1. Technical Field

The present disclosure relates to server backplates and servers having the same.

2. Description of Related Art

Demand for a larger amount of storage is required in servers. Thus, more storage devices need to be installed in the servers. To install more storage devices in a rack server, the storage devices incorporating with a server backplate have to be installed together. However, this may result a bulky server.

Therefore, a server backplate and a server having the same, which can overcome the limitations described, are needed.

DETAILED DESCRIPTION

Figure 1:
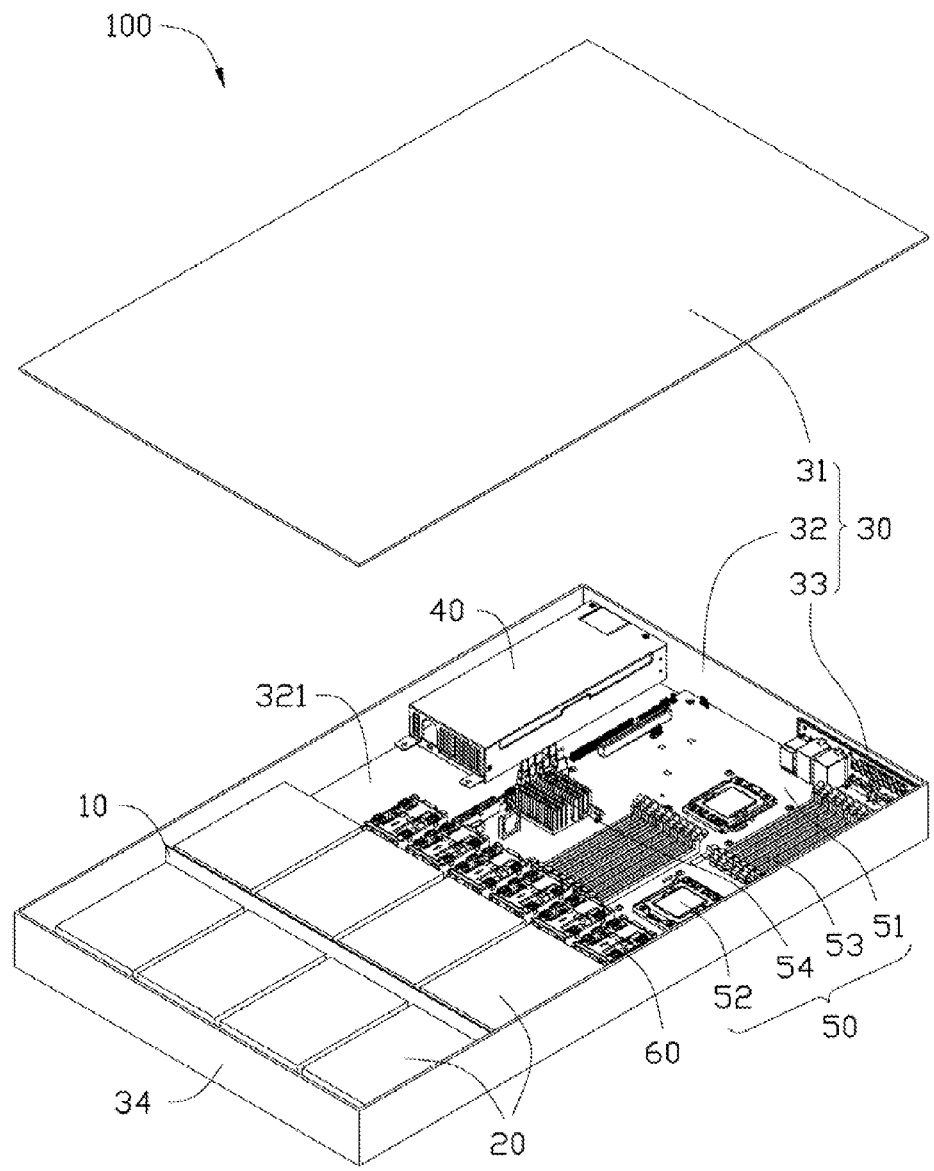
FIG. 1 is a partially exploded view of a server including a server backplate, according to an exemplary embodiment.
Figure 2:
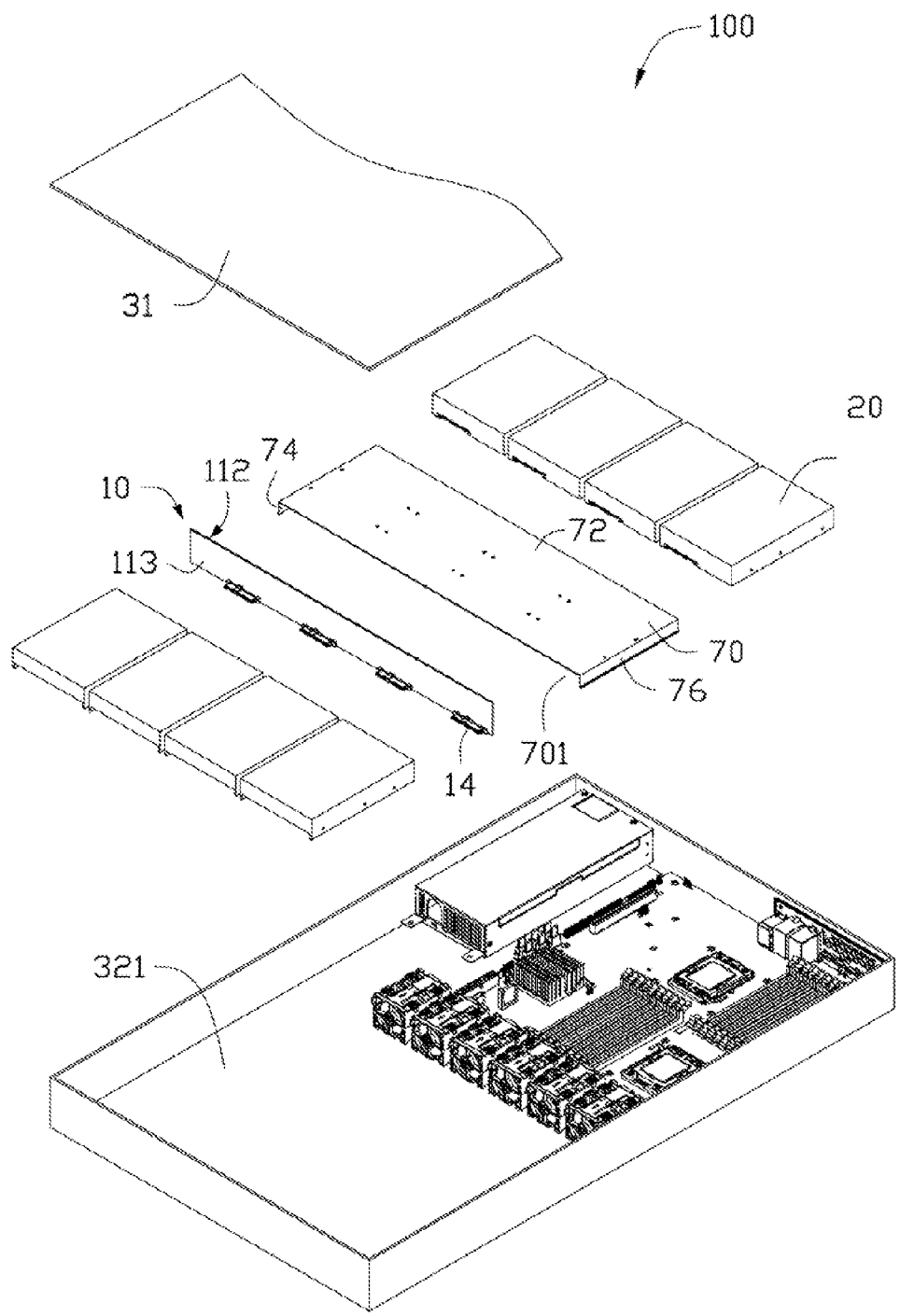
FIG. 2 is a further exploded view of the server of FIG. 1.
Figure 3:
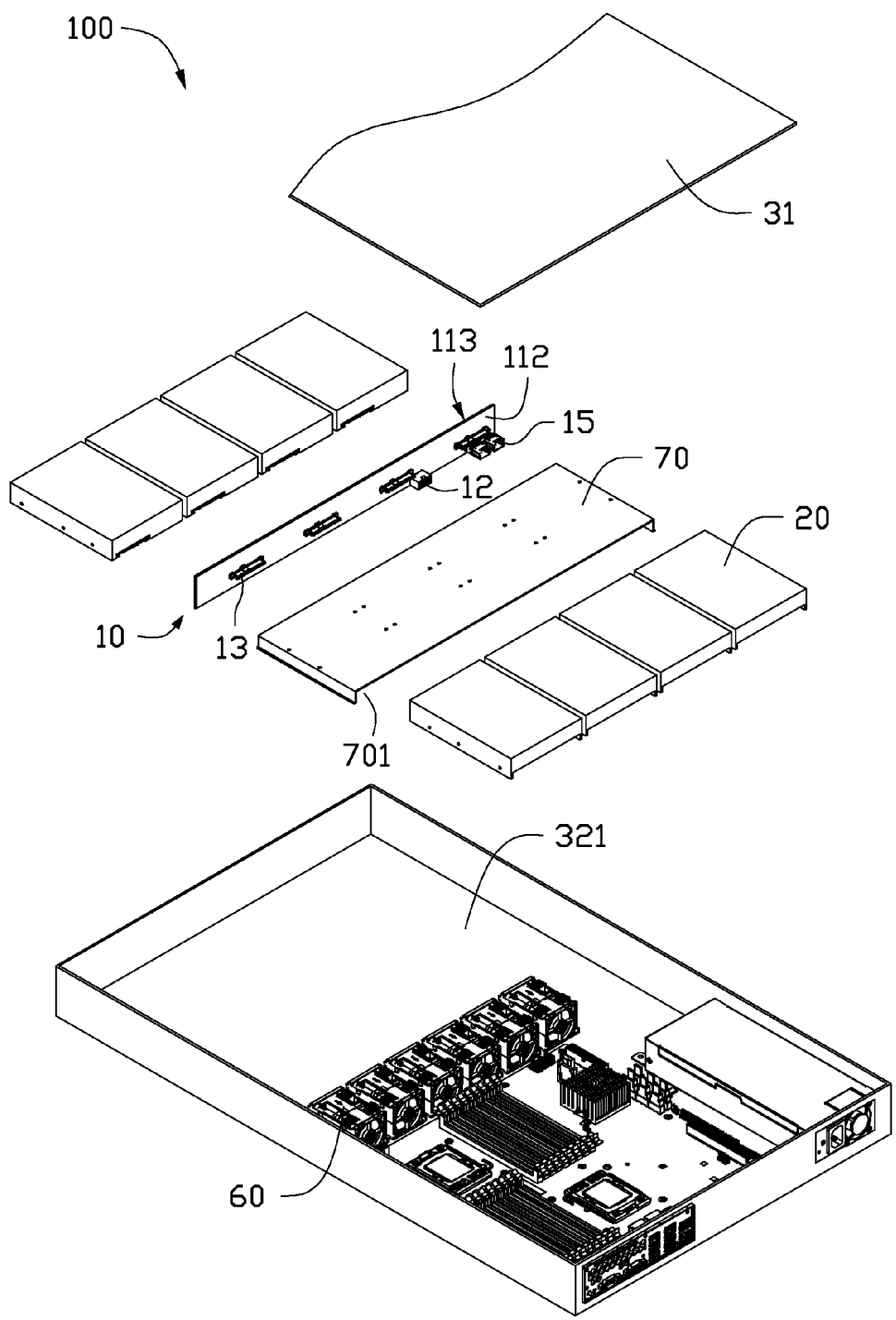
FIG. 3 is similar to FIG. 2, but viewed from another angle.
Figure 4:
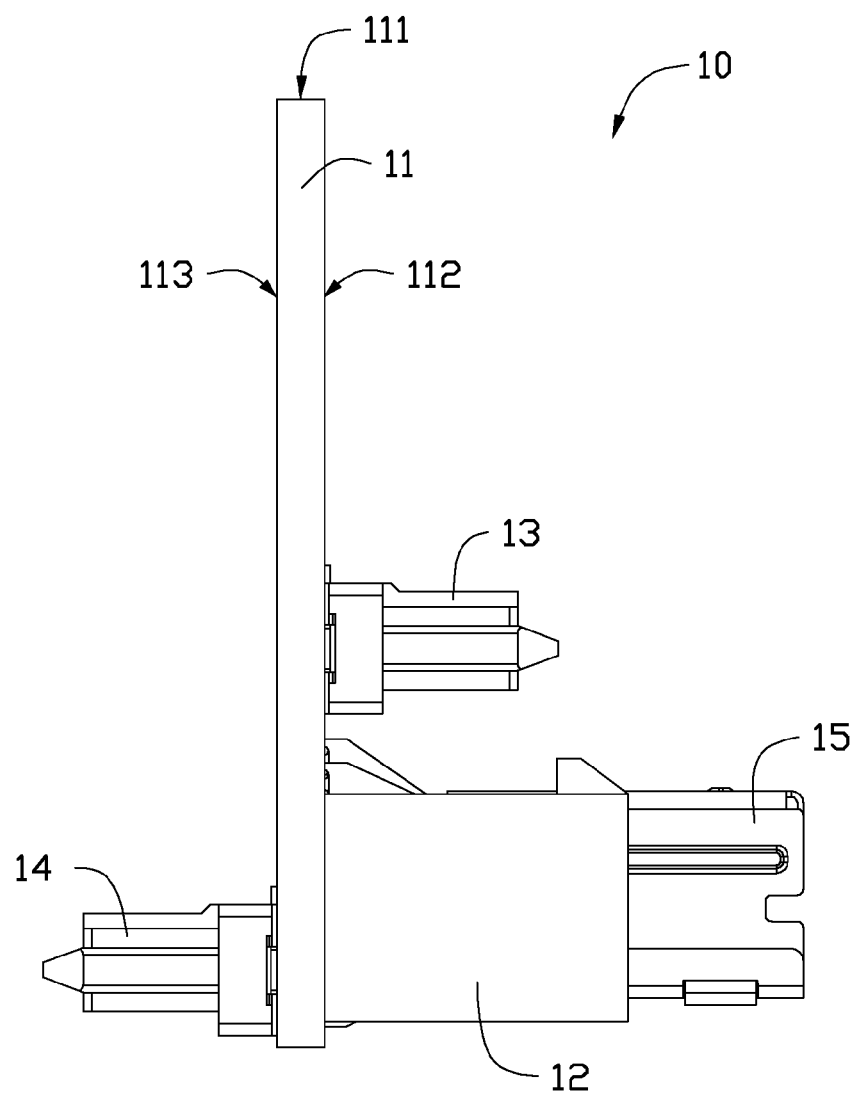
FIG. 4 is a side view of the server backplate of FIG. 1.

Referring to FIGS. 1-4, a server 100, according to an exemplary embodiment, includes a server backplate 10, a number of storage devices 20, a housing 30, a power supply unit 40, a motherboard unit 50, a fan 60 and a support 70. The power supply unit 40, the motherboard unit 50, the fan 60, the backplate 10 and the storage devices 20 are received in the housing 30. The power supply unit 40 is electrically connected to the backplate 10, the motherboard unit 50, and the fan 60 to supply power. In this embodiment, the server 100 is a rack server.

The housing 30 includes a cover 31 and a frame 32. The cover 31 is mounted on the frame 32 to cooperatively form a space for receiving the power supply unit 40, the motherboard unit 50, the fan 60, the backplate 10 and the storage devices 20. The frame 32 is substantially a cuboid and includes an interface plate 33 and a front plate 34. The interface plate 33 is configured for establishing connections between the motherboard unit 50 and other electronic devices, such as a mouse, a keyboard, or a display. The front plate 34 and the interface plate 33 are positioned at opposite ends of the frame 32.

The motherboard unit 50 is mounted on the frame 32 and adjacent to the interface plate 33 for conveniently connecting to the other electronic devices using the interface plate 33. The motherboard unit 50 includes a motherboard 51, a processor 52, a number of extension slots 53 and a heat sink 54. The processor 52, the extension slots 53 and the heat sink 54 are mounted on the motherboard 51. The power supply unit 40 is mounted in a corner of the frame 32.

The backplate 10 and the storage devices 20 are arranged at a side of the frame 32 away from the interface plate 33. The backplate 10 includes a plate 11, a power connector 12, a number of first connectors 13, a number of second connectors 14 and a number of third connectors 15. In this embodiment, the first connector 13 and the second connector 14 are serial attached small computer system interface (SAS) connectors.

The plate 11 includes a top surface 111, a first surface 112 and a second surface 113. The first surface 112 opposes the second surface 113. The top surface 111 connects the first surface 112 to the second surface 113. The first surface 112 is substantially parallel to the second surface 113. The top surface 111 is substantially perpendicular to the first surface 112 and the second surface 113.

The first connectors 13 are arranged in a line on the first surface 112 along the length of the plate 11. The second connectors 14 are arranged in a line on the second surface 113 along the length of the plate 11. The first connector 13 is closer to the top surface 111 than the second connector 14. In this embodiment, an orthogonal projection of the first connector 13 on the second surface 113 is spaced from the second connector 14 and/or an orthogonal projection of the second connector 14 on the first surface 112 is spaced from the first connector 13 (see FIG. 4). In this way, the storage devices 20 can be mounted on two sides of the back plate 10 and more storage devices 20 with one backplate 10 can be installed in the server 100. This results in a compact rack server 100. Furthermore, since the first connector 13 is closer to the top surface 111 than the second connector 14, signal interference and layout interference between the storage devices 20, the first connectors 13 and the second connectors 14 at the two sides of the backplate 10 can be avoided or at least alleviated.

The power connector 12 is arranged on the first surface 112 and is electrically connected to the first connectors 13 and the second connectors 14. The power connector 12 is electrically connected to the power supply unit 40 to power the storage devices 20 from the power supply unit 40. The third connectors 15 are electrically connected to the first and second connectors 13, 14 and the motherboard unit 50 to establish communication between the storage devices 20 and the motherboard unit 50. The third connector 15 is a mini serial attached small computer system interface (mini SAS) connector.

The storage devices 20 are coupled to the first connectors 13 and the second connectors 14. In this embodiment, the storage devices 20 are SAS-type storage devices. The fan 60 is arranged between the storage devices 20 and the motherboard unit 50. That is, the motherboard unit 50, the fan 60, the storage devices 20 mounted on the first surface 112 of the backplate 10, the backplate 10, and the storage devices 20 mounted on the second surface 113 of the backplate 10 are arranged in that order from the interface plate 33 to the front plate 34.

The support 70 is arranged beneath the storage devices 20 which are coupled to the first connectors 13 to support the storage devices 20 in place. The support 70 includes a flat plate 72, a first sideplate 74, and a second side plate 76. The first side plate 74 and the second side plate 76 downwardly extend from opposite ends of the flat plate 72. 74 The support 70 defines a passageway 701 to allow/enhance heat exchange between the fan 60 and the storage devices 20. The flat plate 72, the first side plate 74, and the second side plate 76 cooperatively form the passageway 701.

The number of the connectors 13, 14 and the storage device 20 may be determined according to a practical use.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed

What is claimed is:

1. A server, comprising:
   a first storage device;
   a second storage device;

a power supply unit; and a server backplate, the server backplate comprising:

a plate comprising a top surface, a first surface, and a second surface opposing the first surface, the top surface connecting the first surface and the second surface;

a power connector arranged on the first surface and configured to couple to the power supply unit;

a first connector arranged on the first surface and configured to couple to the first storage device;

a second connector arranged on the second surface and configured to couple to the second storage device, wherein the power connector is electrically connected to the first connector and the second connector, and the first connector is closer to the top surface than the second connector;

a housing, a motherboard unit and a fan, wherein the power supply unit, the motherboard unit, the fan, the backplate and the first and second storage devices are received in the housing, the housing comprises an interface plate for establishing connections between the motherboard unit and other electronic devices and a front plate opposite to the interface plate, the motherboard unit, the fan, the first storage devices, the backplate, and the second storage devices are arranged in that order from the interface plate to the front plate, and the power supply unit is electrically connected to the motherboard unit and the fan.

2. The server of claim 1, further comprising a support, wherein the support is arranged beneath the first storage devices and is configured to support the first storage devices in place.

3. The server of claim 2, wherein the support comprises a flat plate, a first side plate, and a second side plate, the first side plate and the second side plate downwardly extend from opposite ends of the flat plate, the flat plate, the first side plate, and the second side plate cooperatively form a passageway to allow heat exchange between the fan and the first and second storage devices.

4. The server of claim 3, wherein an orthogonal projection of the first connector on the second surface is spaced from the second connector.

5. The server of claim 3, wherein an orthogonal projection of the second connector on the first surface is spaced from the first connector.

6. The server of claim 3, wherein the first storage device and the second storage device are serial-attached-small-computer-system-interface-type storage devices.

7. A server, comprising:

a plurality of first storage devices;

a plurality of second storage devices;

a power supply unit; and a server backplate, the server backplate comprising:

a plate comprising a top surface, a first surface, and a second surface opposing the first surface, the top surface connecting the first surface and the second surface;

a power connector arranged on the first surface and configured to couple to the power supply unit;

a plurality of first connectors arranged on the first surface along the length of the plate and configured to couple to the respective first storage devices;

a plurality of second connectors arranged on the second surface along the length of the plate and configured to couple to the respective second storage devices, wherein the power connector is electrically connected to the first connectors and the second connectors, and each of the first connectors is closer to the top surface than each of the second connectors;

a housing, a motherboard unit and a fan, wherein the power supply unit, the motherboard unit, the fan, the backplate and the first and second storage devices are received in the housing, the housing comprises an interface plate for establishing connections between the motherboard unit and other electronic devices and a front plate opposite to the interface plate, the motherboard unit, the fan, the first storage devices, the backplate, and the second storage devices are arranged in that order from the interface plate to the front plate, and the power supply unit is electrically connected to the motherboard unit and the fan.

8. The server of claim 7, further comprising a support, wherein the support is arranged beneath the first storage devices and is configured to support the first storage devices in place.

9. The server of claim 8, wherein the support comprises a flat plate, a first side plate, and a second side plate, the first side plate and the second side plate downwardly extend from opposite ends of the flat plate, the flat plate, the first side plate, and the second side plate cooperatively form a passageway to allow heat exchange between the fan and the first and second storage devices.

10. The server of claim 9, wherein an orthogonal projection of the first connector on the second surface is spaced from the second connector.

11. The server of claim 10, wherein the first storage device and the second storage device are serial-attached-small-computer-system-interface-type storage devices.

* * * * *